United States Patent
Lee et al.

(10) Patent No.: US 6,303,439 B1
(45) Date of Patent: Oct. 16, 2001

(54) FABRICATION METHOD FOR A TWO-BIT FLASH MEMORY CELL

(75) Inventors: Robin Lee, Hsinchu Hsien; Chih-Hung Lin, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/449,297

(22) Filed: Nov. 24, 1999

(51) Int. Cl.$^7$ ................................................ H01L 21/8247
(52) U.S. Cl. .............................................. 438/259; 438/264
(58) Field of Search .................................... 438/257–267

(56) References Cited

U.S. PATENT DOCUMENTS

| | | | |
|---|---|---|---|
| 5,180,680 | * | 1/1993 | Yang . |
| 5,429,970 | * | 7/1995 | Hong . |
| 5,554,550 | * | 9/1996 | Yang . |
| 5,567,635 | * | 10/1996 | Acovic et al. . |
| 5,616,510 | * | 4/1997 | Wong .................................. 438/259 |
| 5,656,544 | * | 8/1997 | Bergendahl et al. ................ 438/386 |
| 5,705,415 | * | 1/1998 | Orlowski et al. . |
| 5,998,261 | * | 12/1999 | Hofmann et al. .................... 428/257 |
| 5,998,263 | * | 12/1999 | Sekariapuram et al. ............. 438/259 |
| 6,093,606 | * | 7/2000 | Lin et al. ............................. 438/259 |

* cited by examiner

*Primary Examiner*—Richard Booth
(74) *Attorney, Agent, or Firm*—Jiawei Huang; J. C. Patents

(57) ABSTRACT

A method for fabricating a two-bit flash memory cell is described in which a substrate with a trench formed therein is provided. A conformal tunnel oxide layer is then formed on the substrate, followed by forming polysilicon spacers on the portion of the tunnel oxide layer which covers the sidewalls of the trench. The polysilicon spacers are separated into a first polysilicon spacer on the right sidewall and a second polysilicon spacer on the left sidewall. Thereafter, a gate oxide layer is formed on the polysilicon spacers, followed by forming a polysilicon gate on the gate oxide layer in the substrate. Subsequently, a source/drain region is formed on both sides of the polysilicon gate in the substrate.

14 Claims, 3 Drawing Sheets

FABRICATION METHOD FOR A TWO-BIT FLASH MEMORY CELL

BACKGROUND OF THE INVENTION

1. Field of the Invention

The present invention relates to a fabrication method for an integrated circuit device. More particularly, the present invention relates to a fabrication method for a two-bit flash memory cell.

2. Description of the Related Art

FIG. 1 is a schematic, cross-sectional view of an EPROM tunnel oxide (ETOX) structure of a flash memory cell according to the prior art. The ETOX structure is basically the addition of a tunnel oxide layer to the traditional erasable and read-only memory cell. As shown in FIG. 1, beside an oxide layer not being shown in the Figure, the conventional flash memory cell, as illustrated in FIG. 1, comprises a polysilicon gate which is the control gate 104, a polysilicon layer which is the floating gate 102, a source region 106a and a drain region 106b, wherein the source/drain regions 106a, 106b are formed near the two sides of the floating gate 102 in the substrate 100.

The method for programming a bit of binary data to a flash memory cell is to apply a positive voltage to the control gate and a lesser positive voltage to the drain region 106b (or source region 106a) with the source region 106a (or drain region 106b) being grounded. Hot electrons generated between the drain region 106b (or source region 106a) and the substrate are injected into and stored in the floating gate 102. The conventional flash memory cell, however, can only store a data of "1" and "0", and is thereby known as the single-bit flash memory cell.

A drawback of this type of single-bit flash memory cell is that after the hot electrons are injected into the floating gate 102, they do not stay at the two ends of the floating gate 102. The hot electrons tend to redistribute themselves throughout the entire floating gate 102. The redistribution occurs regardless whether that the hot electrons are injected from the source region 106a or from the drain region 106b into the floating gate 102. As a result, the operating mode of this type flash memory cell is limited to a single-bit storage. The occurrence of redistribution not only poses difficulties in the reading operation, it also leads to the serious problem of an over-erase.

SUMMARY OF THE INVENTION

Based on the foregoing, the current invention provides a fabrication method for a two-bit flash memory cell in which a higher integrated flash memory cell can result. The method of the present invention includes forming a shallow trench in a substrate, wherein the trench comprises a left sidewall and a right sidewall. A conformal first oxide layer is then formed on the substrate. Thereafter, a first polysilicon spacer is formed on the tunnel oxide layer that covers the left sidewall of the shallow trench. Concurrently, a second polysilicon spacer is formed on the tunnel oxide layer that covers the right sidewall of the trench. A second oxide layer is then formed on the substrate covering the first polysilicon spacer and the second polysilicon spacer. A second oxide layer is concurrently formed on the substrate. Subsequently, an ion implantation is conducted to form the source/drain region at the two sides of the gate in the substrate.

According to the preferred embodiment of the present invention, the second oxide layer is formed by growing an oxide layer on the first and the second polysilicon spacers via a thermal oxidation process. The first oxide layer, which is not covered by the first and the second polysilicon spacer, would become thicker. A second method in forming the second oxide layer includes deposition.

In another words, the present invention provides a two-bit flash memory cell, wherein the flash memory cell includes a substrate comprising a trench. The trench is sequentially filled with the following components. A conformal first oxide layer is formed on the trench, followed by forming polysilicon spacers on the first oxide layer, which covers the sidewalls of the trench. A second oxide layer is then formed on the polysilicon spacers, to sufficiently cover the polysilicon spacers. A polysilicon gate, excessively filling the shallow trench, is formed on the second oxide layer, wherein a source/drain region is further formed on both sides of the polysilicon gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 2:
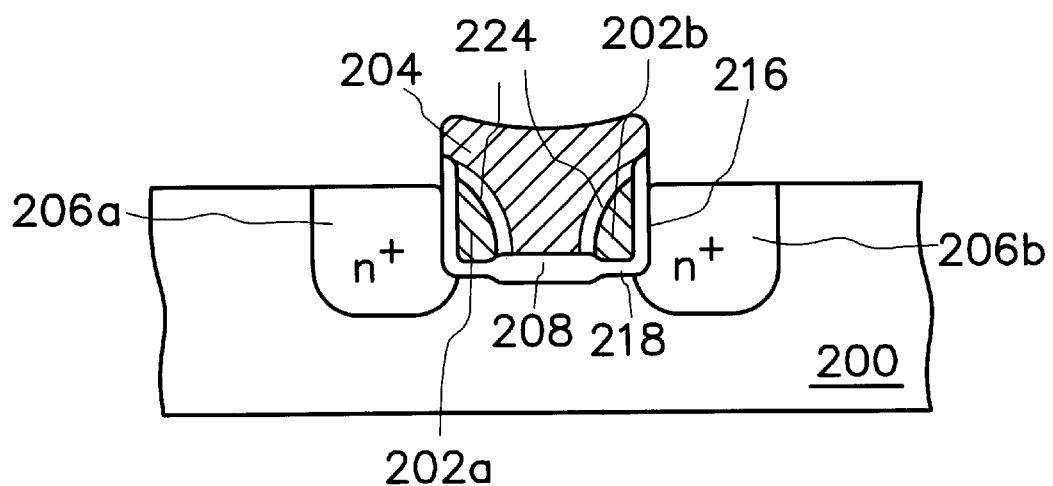
FIG. 2 is a schematic, cross-sectional view of a flash memory cell according to the present invention.

FIG. 2 is a schematic, cross-sectional view of a flash memory cell according to the present invention.

Referring to FIG. 2, the flash memory cell provided in the preferred embodiment of the present invention is a two-bit flash memory cell.

As shown in FIG. 2, the present invention provides a flash memory cell, which is a two-bit flash memory cell. The flash memory cell includes a substrate 200 having a trench 216. Sequential formations in the trench include forming a conformal first oxide layer 218, after which polysilicon spacers 202b, 202a are then formed on the first oxide layer 218 which covers the sidewalls of the trench 216. The portion of the first oxide layer 218 in between the polysilicon spacers is designated by reference numeral 208. A second oxide layer 224 is then formed to sufficiently cover the polysilicon spacers 202b, 202a. Subsequently, a polysilicon gate 204 is formed on the second oxide layer 224, excessively filling the trench 216, wherein source/drain regions 206a, 206b are formed on both sides of the polysilicon gate 204 in the substrate 200.

Figure 1:
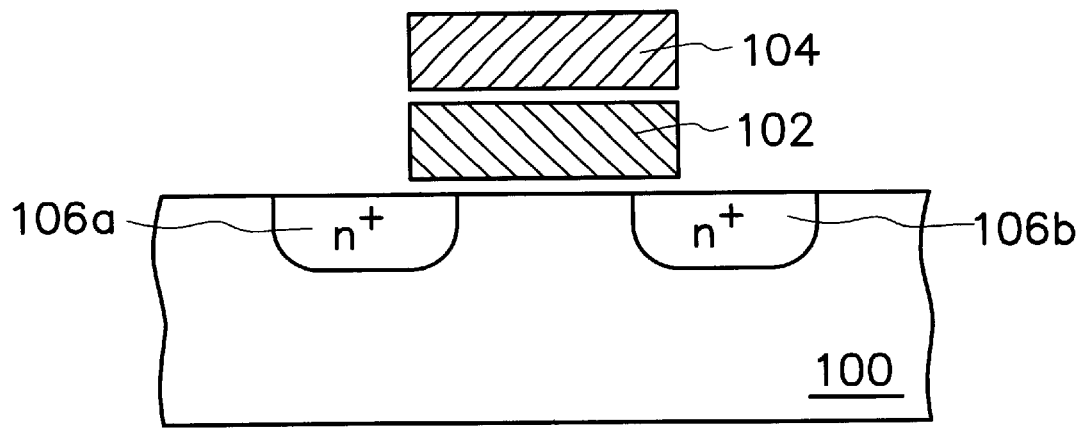
FIG. 1 is a schematic, cross-sectional view of a flash memory cell according to the prior art.

Compared with the conventional flash memory cell as illustrated in FIG. 1, the present invention provides two polysilicon components for storing the hot electrons. The two polysilicon components are the first polysilicon spacer 202b and the second polysilicon spacer 202a as shown in FIG. 2. As a result, the present invention provides a 2-bit flash memory cell such that charge redistribution is prevented.

FIGS. 3A to 3E are schematic, cross-sectional views showing the manufacturing of a flash memory cell according to the present invention.

Figure 3A:
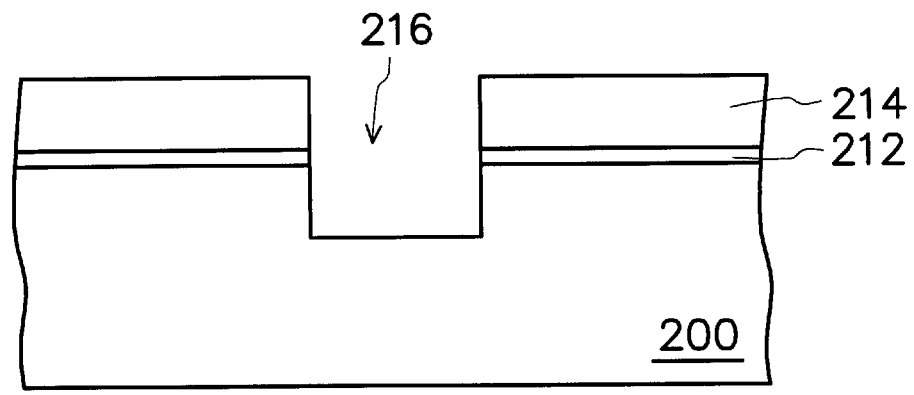
FIGS. 3A to 3E are schematic, cross-sectional views showing the manufacturing of a flash memory cell according to the present invention.

Referring to FIG. 3A, a pad oxide layer (not shown in Figure) and a silicon nitride layer (not shown in Figure) are sequentially formed on the substrate 200, for example, a P-type silicon substrate, followed by patterning the pad oxide layer and the silicon nitride layer. With the patterned pad oxide layer 212 and the patterned silicon nitride layer 214 serving as a mask, the substrate 200 is etched to form a shallow trench 216, wherein the trench 216 comprises a left sidewall and a right sidewall.

Figure 3B:
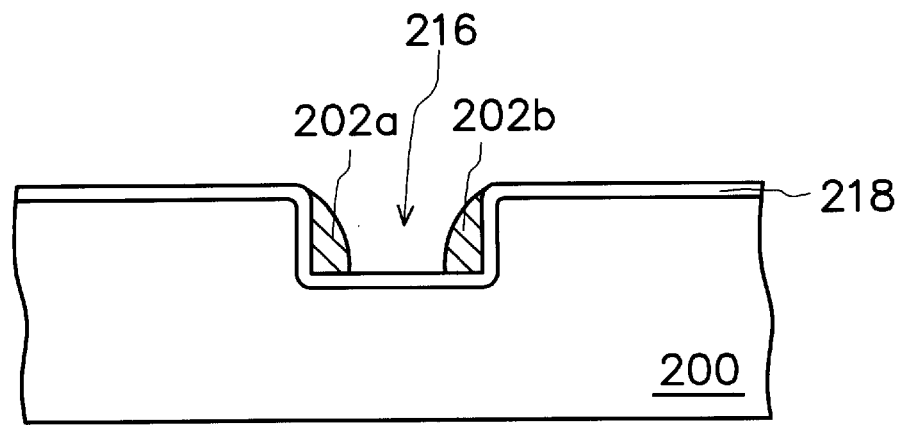

Referring to FIG. 3B, the patterned silicon nitride layer 214 (as in FIG. 3A) and the pad oxide layer 212 (as in FIG. 3A) are removed. Although the shallow trench 216 is formed following the techniques disclosed in the above, a shallow trench 216 formed by other techniques still falls within the scope and spirit of the present invention.

Still referring to FIG. 3B, a conformal tunnel oxide layer 218 with a thickness of about 30 Å to about 100 Å is formed on the substrate 200. A first polysilicon spacer 202b is then formed on the tunnel oxide layer 218 that covers the right sidewall of the shallow trench 216. Concurrently, a second polysilicon spacer 202a is formed on the tunnel oxide layer 218 covering the left sidewall of the trench 216. The first polysilicon spacer 202b and the second polysilicon spacer 202a are formed by, for example, forming a polysilicon layer (not shown) on the substrate 200 and excessively filling the trench 216, followed by back etching the polysilicon layer using the substrate 200 surface outside the trench 216 as an etching end-point.

Figure 3C:
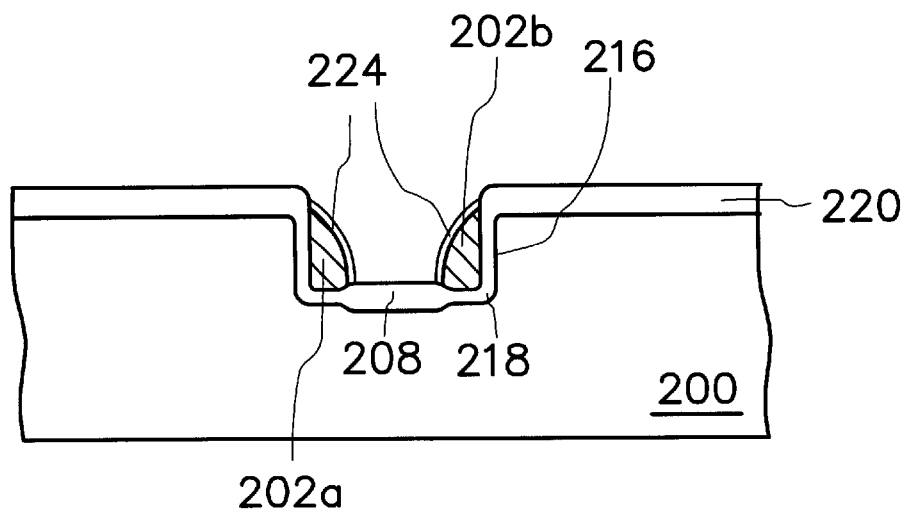

As shown in FIG. 3C, a gate oxide layer 224 is then formed on the polysilicon spacers 202b, 202a. The gate oxide layer 224 can be formed by two methods. One method is to grow a very thin oxide layer on the polysilicon spacers 202b, 202a by means of thermal oxidation. The tunnel oxide layer 208 in between the polysilicon spacers 202b, 202a would become thicker.

Another gate oxide layer formation method applies the thermal oxidation technique with deposition, for example, forming a conformal gate oxide layer (not shown) on the substrate 200 by means of chemical vapor deposition.

Figure 3D:
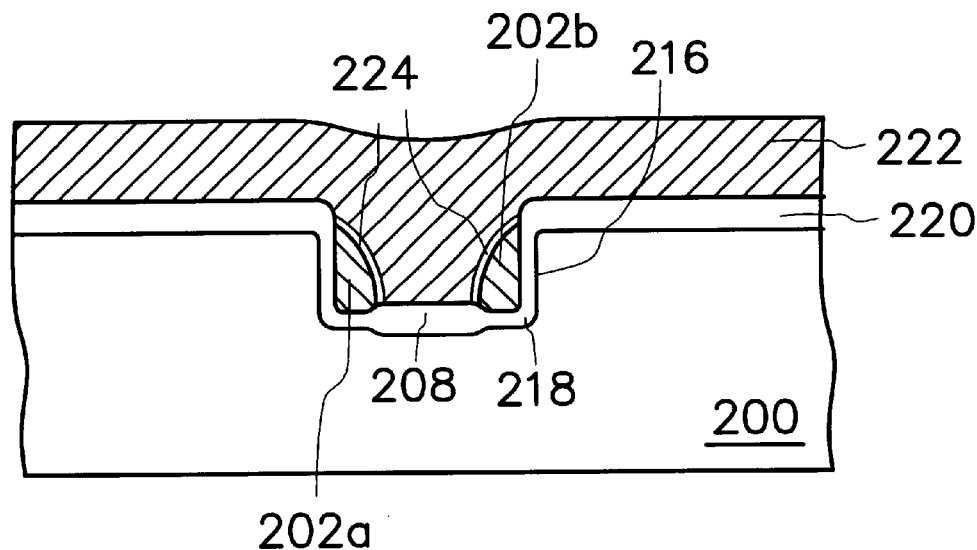

Referring to FIG. 3D, a polysilicon layer 222 is formed on the substrate 200, which excessively fills the trench 216 to cover the gate oxide layer 224.

Figure 3E:
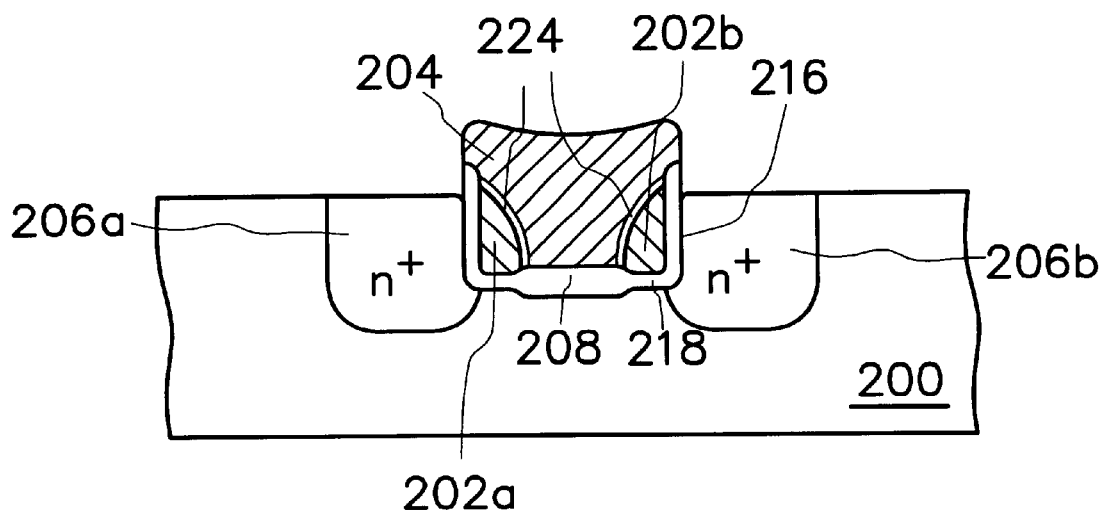

Continuing to FIG. 3E, the polysilicon layer 222 (as in FIG. 3D) is patterned and etched to form a polysilicon gate 204. The tunnel oxide layer 220 (as in FIG. 3D) on the substrate 200 surface is also being etched to form a patterned tunnel oxide layer 208.

Thereafter, an ion implantation is conducted on the two sides of the polysilicon gate 204 in the substrate 200 to form a source region 206a and a drain region 206b, wherein the implanted ion can be an N-type dopant to form an N-type source/drain region.

Mechanisms of the different operations performed by the flash memory cell according to by the present invention are described below.

When data is to be erased/programmed, a positive voltage is applied to the source/drain regions 206a, 206b and a negative voltage is applied to the polysilicon gate 204 as shown in FIG. 3E or FIG. 2, forcing the trapped hot electrons to flow outward from the polysilicon spacers 202b, 202a and tunnel through the tunnel oxide layer 218 underneath the polysilicon spacers 206a, 206b. Once the hot electrons are evacuated from the polysilicon spacers 206a, 206b, the memory is erased.

When a bit of data is programmed/erased to a memory cell, an electrical voltage Vcc is applied to the drain region 206b while the source region 206a is normally being grounded. In addition, a positive voltage is applied to the polysilicon gate 204. Since the drain region 206b is not protected with a lightly doped drain (LDD), a significant increase in the number of the carriers occurs at the junction between the drain region 206b and the substrate 200. A portion of the hot electrons generated is collected in the drain region 206b. A portion of the hot electrons, however, is driven to pass through the tunnel oxide layer 218 and is injected into the first polysilicon spacer 202b due to the strong electric field created at the polysilicon gate 204. The first polysilicon spacer 202b then becomes charged. Once the hot electrons are in the first polysilicon spacer 202b, they are trapped by the high-energy barrier of the surrounding tunnel oxide layer 218 and reside therein. Additionally, a positive voltage can applied to the polysilicon gate 204 while the source/drain regions 206a, 206b are being grounded. In this way, memory cell can be erased using Fowler-Nordheim tunneling.

When data the stored in a memory cell according to above programming operation, a positive voltage is applied to the polysilicon gate 204 and a positive voltage is applied to the source region 206b to read the information stored in the first polysilicon spacer 206a. In another words, if there are trapped electrons in the first polysilicon spacer 202b, a pre-defined binary data of "1" or "0" is read. Otherwise, a pre-defined binary data of "0" or "1" is read if there are no electrons trapped inside the first polysilicon spacer 202b.

The present invention, in addition, further provides another flash memory cell programming operation in which a positive charge Vcc is applied on the source region 206a while the drain region 206b is being grounded. In addition, a positive voltage is applied on the polysilicon gate 204. Besides a portion of the hot electrons generated at the junction between the source region 206a and the substrate 200 is being collected in the source region 206a, a portion of the hot electrons passes through the tunnel oxide layer 218 and is injected into the second polysilicon spacer 202a due to the strong electric field created at the polysilicon gate 204. The second polysilicon spacer 202a then becomes charged.

When the data is stored in a memory cell according to the above programming operation is to be read, a positive voltage is applied to the polysilicon gate 204 and a positive voltage is applied to the drain region 206a to read the information stored in the second polysilicon spacer 202a. If there are trapped electrons within the second polysilicon spacer 202a, a pre-defined binary data of "1" or "0" is read. Otherwise, a pre-defined binary data of "0" or "1" is read if there are no electrons trapped inside the second polysilicon spacer 202a.

Based on the above approaches, the first polysilicon spacer 202b and the second polysilicon spacer 202a can both be used for storing data. The flash memory cell of this structure can have four different charge conditions (0,0), (0,1), (1,0), (1,1). The present invention thus provides a two-bit flash memory cell.

The present invention provides a flash memory cell in which the problem of redistribution of charge is prevented. In other words, the electrons injected into the first polysilicon spacer will not redistribute to the second polysilicon spacer and the electrons injected into the second polysilicon spacer will not redistribute to the first polysilicon spacer. Since the present invention provides two isolated polysilicon spacers for storing data, a 2-bit flash memory cell is provided.

Although in the above embodiment the present invention has been described with respect to a P-type silicon substrate and an N-type source/drain region, the invention is also applicable to an N-type silicon substrate and a P-type source/drain region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a flash memory cell, the method comprising the steps of:

forming a shallow trench in the substrate, wherein the trench comprises a left sidewall and a right sidewall;

forming a conformal first oxide layer on the substrate;

forming a first polysilicon spacer on the first oxide layer which completely covers the right sidewall;

forming a second polysilicon spacer on the first oxide layer which completely covers the left sidewall;

forming a second oxide layer to cover the first polysilicon spacer;

forming a second oxide layer to cover the second polysilicon spacer;

forming a polysilicon gate in the substrate and covering the second oxide layer; and conducting an ion implantation process to form a source/drain region on two sides of the polysilicon gate in the substrate.

2. The fabrication method for a flash memory cell according to claim 1, wherein the first oxide layer is a tunnel oxide layer with a thickness of about 30 Å to 100 Å.

3. The fabrication method for a flash memory cell according to claim 1, wherein the second oxide layer is formed by growing the second oxide layer on the first polysilicon spacer and the second polysilicon spacer by means of a thermal oxidation process.

4. The fabrication method for a flash memory cell according to claim 3, wherein the first oxide layer not covered by the first and the second polysilicon spacers becomes thick when the second oxide layer is formed.

5. The fabrication method for a flash memory cell according to claim 1, wherein the second oxide layer is formed by deposition.

6. The fabrication method for a flash memory cell according to claim 1, wherein the first polysilicon spacer is formed by a method comprising the steps of:

forming a polysilicon layer on the substrate to excessively fill the trench; and back etching the polysilicon layer using a surface of the substrate outside the trench as an etching end-point.

7. The fabrication method for a flash memory cell according to claim 1, wherein the second polysilicon spacer is formed by a method comprising the steps of:

forming a polysilicon layer on the substrate to excessively fill the trench; and back etching the polysilicon layer using a surface of the substrate outside the trench as an etching end-point.

8. The fabrication method for a flash memory cell according to claim 1, wherein the substrate is a P-type silicon substrate.

9. The fabrication method for a flash memory cell according to claim 8, wherein the source/drain region is an N-type source/drain region.

10. The fabrication method for a flash memory cell according to claim 1, wherein the substrate is an N-type silicon substrate.

11. The fabrication method for a flash memory cell according to claim 10, wherein the source/drain region is a P-type source/drain region.

12. A fabrication method for a flash memory cell, the method comprising the steps of:

providing a substrate;

forming a trench in the substrate, wherein the trench comprises a left sidewall and a right sidewall;

forming a conformal first oxide layer on the substrate;

forming a first polysilicon spacer on the first oxide layer completely covering the right sidewall of the trench;

forming a second polysilicon spacer on the first oxide layer completely covering the left sidewall of the trench;

conducting a thermal oxidation process to grow a second oxide layer on the first polysilicon spacer and on the second polysilicon spacer;

forming a polysilicon gate in the substrate and covering the second oxide layer; and forming a source/drain region on two sides of the gate in the substrate.

13. The fabrication method for a flash memory cell according to claim 12, wherein the first polysilicon spacer and the second polysilicon spacer are formed by a method comprising the steps of:

forming a polysilicon layer on the substrate and filling the trench; and back etching the polysilicon layer.

14. The fabrication method for a flash memory cell according to claim 12, wherein the source/drain region is formed by an ion implantation process.

* * * * *